United States Patent
Kinugasa et al.

(12) 
(10) Patent No.: US 6,337,603 B1
(45) Date of Patent: Jan. 8, 2002

(54) TEMPERATURE DETECTOR CIRCUIT HAVING FUNCTION FOR RESTRICTING OCCURRENCE OF OUTPUT ERROR CAUSED BY DISPERSION IN ELEMENT MANUFACTURE

(75) Inventors: Masanori Kinugasa, Yokohama; Yoshimitsu Itoh, Kawasaki; Masaru Mizuta, Kamakura; Akira Takiba, Kawasaki; Shinji Inada, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/606,016

(22) Filed: Jun. 29, 2000

(30) Foreign Application Priority Data

Jun. 30, 1999 (JP) .......................................... 11-186989

(51) Int. Cl.$^7$ .............................. H03B 5/04; H03B 5/36
(52) U.S. Cl. ....................... 331/66; 331/158; 331/177 V
(58) Field of Search ................................. 31/65, 66, 69, 31/70, 116 R, 116 FE, 158, 175, 176, 177 V

(56) References Cited

U.S. PATENT DOCUMENTS 4,949,055 A * 8/1990 Leitl .......................... 331/158
5,081,431 A * 1/1992 Kubo et al. ................. 331/158

FOREIGN PATENT DOCUMENTS

JP 4-236517 8/1992

* cited by examiner

Primary Examiner—David Mis
(74) Attorney, Agent, or Firm—Oblon, Spivak, McClelland, Maier & Neustadt, P.C.

(57) ABSTRACT

A temperature detector circuit for converting a forward drop voltage of a diode to digital data by means of an AD converter is provided. In order to restrict an occurrence of an output error caused by dispersion in diode manufacture, correction data according to digital data obtained by the AD converter is stored in advance in a storage circuit under a known arbitrary temperature condition, and subtraction is performed between digital data obtained by the AD converter under an unknown temperature condition and correction data read from a storage circuit, thereby to perform correction.

8 Claims, 2 Drawing Sheets

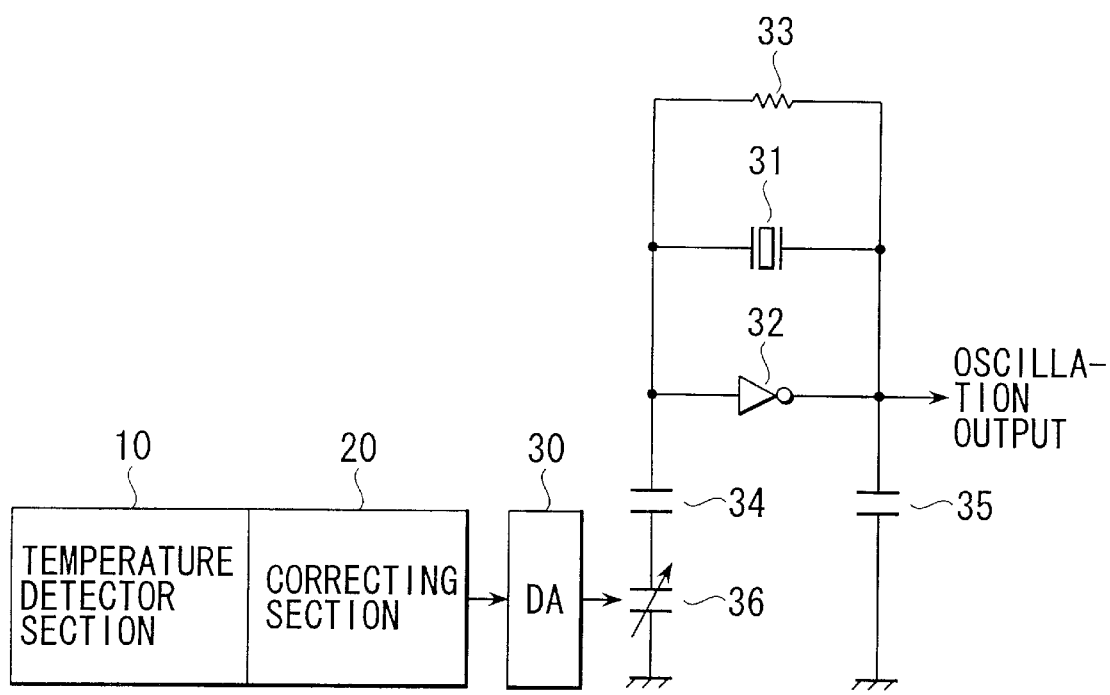
FIG. 4
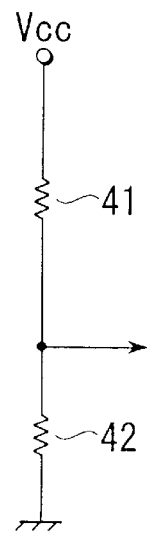
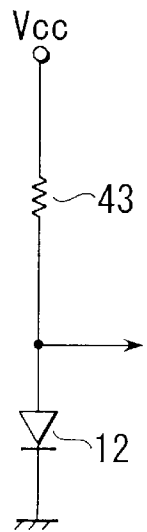
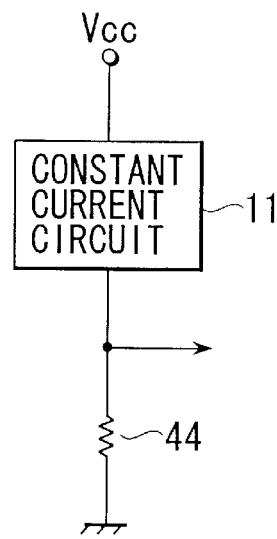
FIG. 5A    FIG. 5B    FIG. 5C

TEMPERATURE DETECTOR CIRCUIT HAVING FUNCTION FOR RESTRICTING OCCURRENCE OF OUTPUT ERROR CAUSED BY DISPERSION IN ELEMENT MANUFACTURE

CROSS-REFERENCE TO RELATED APPLICATIONS

This application is based upon and claims the benefit of priority from the prior Japanese Patent Application No. 11-186989, filed Jun. 30, 1999, the entire contents of which are incorporated herein by reference.

BACKGROUND OF THE INVENTION

The present invention relates to a temperature detector circuit for outputting digital data according to a temperature in atmosphere the detector circuit has been installed. In particular, the present invention relates to an improvement which allows restriction of an occurrence of an output error caused by dispersion in manufacture of an element for generating an analog signal according to an atmospheric temperature.

A number of semiconductor device systems are required to make adjustment according to a temperature in atmosphere in which the systems have been installed. For example, it is known that, in an oscillator circuit for generating a clock signal using a crystal oscillator, an oscillation frequency changes according to the atmospheric temperature. That is, in general, in the crystal oscillator, a specific oscillation frequency is determined depending on its cutting method and thickness, and however, the oscillation frequency varies depending on the temperature change of the atmosphere in which the oscillator has been installed. Frequency variation characteristics for the temperature of the crystal oscillator is expressed by a tertiary function.

In order to always oscillate an oscillator circuit using such crystal oscillator at a constant frequency without depending on the atmospheric temperature, it is required to generate a control signal according to the atmospheric temperature and control an operation of the oscillator circuit based on this control signal. A temperature detector circuit is used to generate a control signal according to the atmospheric temperature.

FIG. 1 is a block diagram showing an IC temperature detector circuit which has been conventionally used. In this circuit, a constant current is supplied to a diode 52 by means of a constant current circuit 51, and a forward drop voltage Vf obtained at an anode of the diode 52 is digital-converted by means of an AD converter 53, whereby a digital output according to the atmospheric temperature is obtained. That is, this temperature detector circuit is adopted to measure a temperature utilizing a temperature coefficient (in general, −2 mV/° C.) which the forward drop voltage Vf of the diode 52 has.

However, there has been a problem that dispersion in characteristics of the diode 52 occurs due to various fluctuation factors in an IC manufacturing process, whereby a difference occurs with a digital output from a different circuit under the same temperature condition.

In a conventional temperature detector circuit, a difference occurs with a digital output under the same temperature condition due to various fluctuation factors during a process for manufacturing an element for generating an analog signal according to the atmospheric temperature. As a result, there has been a problem that control properties and stability are lost in a system in which operation is controlled based on the digital output from this temperature detector circuit.

BRIEF SUMMARY OF THE INVENTION

It is an object of the present invention to provide a temperature detector circuit capable of obtaining the substantially same digital output under the same temperature condition without depending on various fluctuation factors during a process for manufacturing an element for generating an analog signal according to the atmospheric temperature.

According to a first aspect of the present invention, there is provided a temperature detector circuit comprising: an analog signal generator circuit configured to generate an analog signal which changes according to the atmospheric temperature; an AD converter circuit configured to receive the analog signal and convert the analog signal into digital data to be output; a data storage circuit configured to store correction data in advance according digital data obtained by the AD converter circuit under a known arbitrary temperature condition and read the stored correction data; and a calculating circuit configured to receive digital data obtained by the AD converter circuit under an unknown temperature condition and the correction data read from the data storage circuit, and output digital data corrected by performing calculation between these data.

According to a second aspect of the present invention, there is provided an oscillator circuit comprising: an analog signal generator circuit configured to generate an analog signal which changes according to the atmospheric temperature; an AD converter circuit configured receive the analog signal and convert the analog signal into digital data to be output; a data storage circuit configured to store correction data in advance according to digital data obtained by the AD converter circuit under a known arbitrary temperature condition, and read the stored correction data; a calculating circuit configured to receive digital data obtained by the AD converter circuit under an unknown temperature condition and correction data read from the data storage circuit, and output the digital data corrected by performing calculation between these data; a DA converter circuit configured to receive the corrected digital data output from the calculating circuit and convert the digital data into an analog signal to be output; a crystal oscillator having one end and the other end; a feedback circuit connected between one end and the other end of the crystal oscillator; a first capacitor connected between one end of the crystal oscillator and a supply node of a determined voltage; a second capacitor connected between the other end of the crystal oscillator and the supply node of the predetermine voltage; and a variable capacitor element connected in series into the second capacitor between one end of the crystal oscillator and the supply node of the predetermined voltage, the element receiving the analog signal output from the DA converter circuit and causing a value to be changed according to the analog signal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a circuit diagram showing an oscillator circuit using the temperature detector circuit according to the present invention; and FIGS. 5A to 5C are circuit diagrams showing a configuration of a part of a temperature detector section according to a modified example of the present invention.

DETAILED DESCRIPTION OF THE INVENTION

Hereinafter, the present invention will be described with reference to the accompanying drawings by way of showing embodiments.

Figure 1:
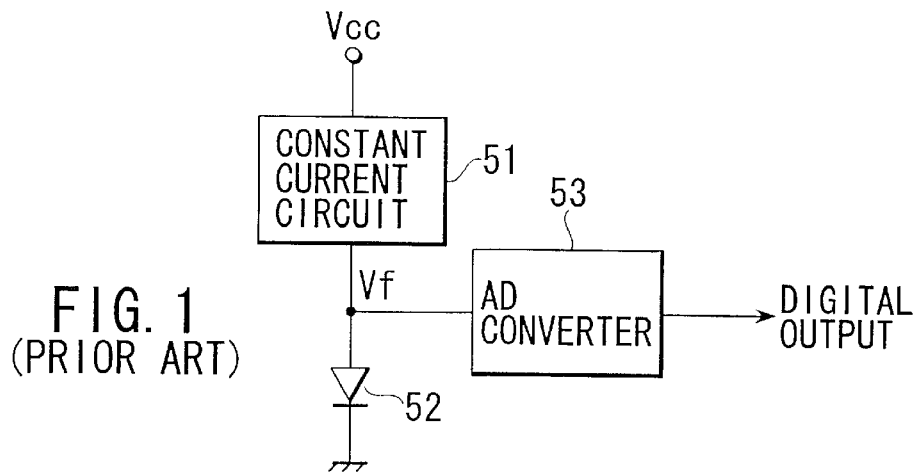
FIG. 1 is a block diagram showing a conventional temperature detector circuit.
Figure 2:
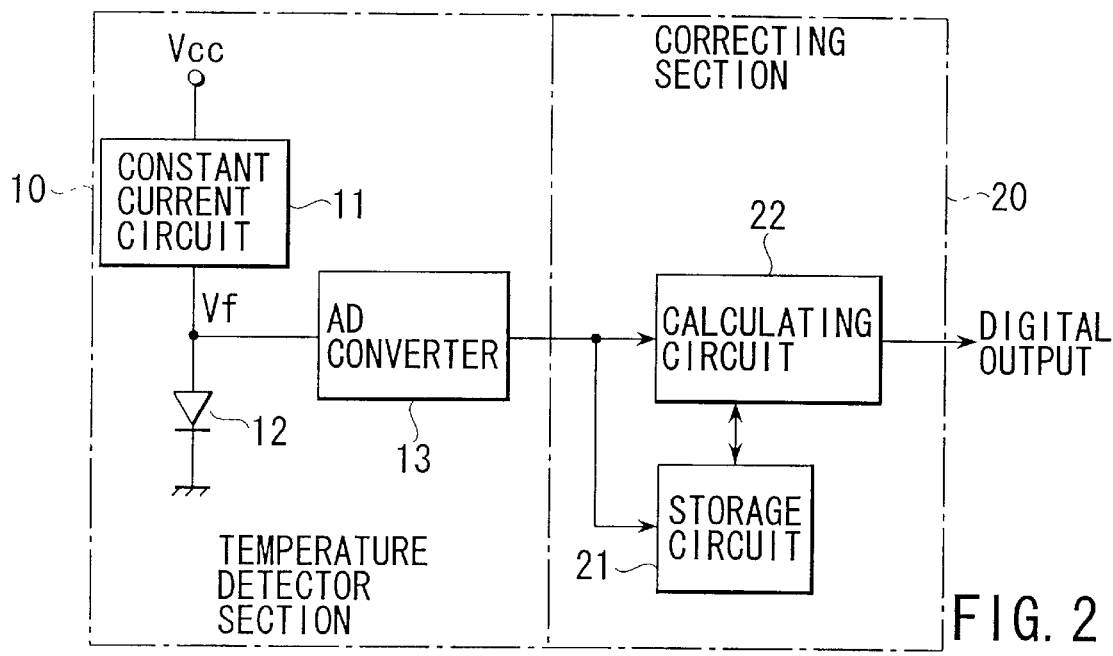
FIG. 2 is a block diagram showing a temperature detector circuit according to one embodiment of the present invention.

FIG. 2 is a block diagram showing a temperature detector circuit according to one embodiment of the present invention. This temperature detector circuit is an IC circuit which comprises a temperature detector section 10 and a correcting section 20.

The temperature detector section 10 comprises a constant current circuit 11 for outputting a constant current; a diode 12; and an AD converter 13. A current path between an anode and a cathode of the diode 12 and the constant current circuit 11 are connected in series between a supply node of a power voltage Vcc and a node of a ground voltage. That is, a constant current output from the constant current circuit 11 is supplied to the diode 12, and a forward drop voltage Vf is generated at an anode of the diode 12. The voltage Vf generated at the diode 12 is supplied to the AD converter 13, and is converted into digital data.

The correcting section 20 comprises a nonvolatile memory element, for example, a storage circuit 21 for storing precalculated correction data; and a calculating circuit 22 for outputting the corrected digital data by performing calculation between digital data read from the temperature detector section 10 and the correction data stored in the storage circuit 21 and read from the storage circuit 21.

In the storage circuit 21, correction data calculated by the calculating circuit 22 is written in advance based on digital data output from the AD converter 13 under a known temperature atmosphere.

In such arrangement, the digital data digital-converted by the AD converter 13 is supplied to the calculating circuit 22 under an arbitrary atmospheric temperature condition. In addition, at the same time, the correction data stored in advance in the storage circuit 21 is read, and is supplied to the calculating circuit 22. The calculating circuit 22 performs calculation in advance between the digital data digital-converted by the AD converter 13 and correction data read from the storage circuit 21, and outputs the corrected digital data.

Now, a method for producing correction data stored in advance in the storage circuit 21 will be described here. The temperature detector section 10 is arranged so that digital data output from the AD converter linearly changes in units of one bit every time the atmospheric temperature changes by 1° C.

First, a reference temperature Tk (° C.) is determined in advance. This reference temperature Tk (° C.) is set to 25° C., for example. Under a known condition for atmospheric temperature Ta (for example, 28° C.), digital data output from the AD converter 13 is measured. When the digital data is defined as Sa, and an eight bit output is represented in hexadecimal notation, Sa is assumed to be (87H). An expected value Sk to be output from the calculating circuit 22 at the reference temperature Tk (25° C.) is assumed to be (80H) (similarly in hexadecimal notation).

Figure 3:
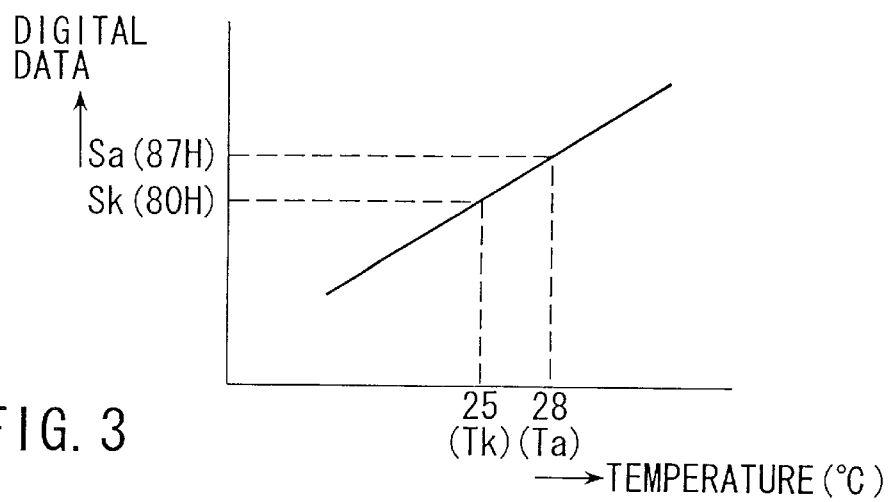
FIG. 3 is a characteristic diagram for explaining a method for generating correction data in the temperature detector circuit shown in FIG. 2.

A relationship between the digital data Sa (87H) under a known condition for atmospheric temperature (28° C.) and the expected value Sk (80H) of digital data under condition for a reference temperature Tk (25° C.) is shown in the characteristic diagram of FIG. 3.

At this time, assuming that the correction data is Y, Y is given by the formula below.

$$Y = Sa - (Ta - Tk) - Sk \qquad (1)$$

For (Ta−Tk) (° C.), the result is (28−25) (° C.)=3. When this value is represented in hexadecimal notation, the result is 03H. When each value is substituted as the formula (1), the result is shown below.

$$Y = 87H - 03H - 80H = 04H \qquad (2)$$

The above calculation is performed by the calculating circuit 22, whereby correction data is created, and then, the correction data is written into the storage circuit 21. That is, in this case, data represented by (04H) in hexadecimal notation is stored in the storage circuit 21.

After correction data has been stored in the storage circuit 21, a temperature is measured. That is, under an unknown temperature condition, digital data digital-converted by the AD converter 13 is supplied to the calculating circuit 22. In addition, at the same time, correction data stored in advance in the storage circuit 21 is read, and is supplied to the calculating circuit 22. The calculating circuit 22 subtracts the correction data (04H) stored in the storage circuit 21 from the digital data digital-converted by the AD converter 13, thereby outputting the corrected digital data.

For example, in the case where the atmospheric temperature is 28° C., the digital data digital-converted by the AD converter 13 is obtained as (87H) in hexadecimal notation, and the calculating circuit 22 subtracts the correction data (04H) from the data (87H). The data on the subtraction result is obtained as (83H). The data (83H) indicates that it is higher than the expected value Sk (80H) of digital data under the condition for reference temperature Tk (25° C.) by 3° C. Thus, the output data (83H) after correction is digital data corresponding to a temperature of 28° C. which is higher than the reference temperature Tk (25° C.) by 3° C.

In the case where an atmospheric temperature is 30° C., the digital data digital-converted by the AD converter 13 is obtained as (89H) in hexadecimal notation. The calculating circuit 22 subtracts the correction data (04H) from the data (89H). The data on the subtraction result is (85H). The data (85H) indicates that it is higher than the expected value Sk (80H) of the digital data under a condition for the reference temperature Tk (25° C.) by 5° C. Thus, the output data (85H) after correction is digital data corresponding to a temperature of 30° C. which is higher than the reference temperature Tk (25° C.) by 5° C.

Further, in the case where an atmospheric temperature is 23° C., the digital data digital-converted by the AD converter 13 is obtained as (82H) in hexadecimal notation. The calculating circuit 22 subtracts the correction data (04H)

from the data (82H). The data on the subtraction result is (7EH). The data (7EH) indicates that it is lower than the expected value Sk (80H) of the digital data under a condition for the reference temperature Tk (25° C.) by 2° C. The output data (7EH) after correction is digital data corresponding to a temperature of 23° C. which is lower than the reference temperature Tk (25° C.) by 2° C.

In this way, according to the temperature detector circuit according to the above embodiment, correction data is produced based on digital data obtained by being digital-converted under a known temperature condition (for example, 28° C. as shown above), and the correction data is stored in the storage circuit 21 so as to perform correction using the correction data when a known temperature is measured.

Therefore, dispersion in characteristics of the diodes in the respective temperature detector circuit occurs due to various fluctuation factors during a manufacturing process. Even if there occurs a difference in digital data output from the AD converter under the same temperature condition, there does not occur a substantial difference in digital data output from the calculating circuit 22.

In the present embodiment, although a case in which the correction data Y is obtained by the calculating circuit 22 has been described, it may be accomplished by supplying an output of the AD converter 13 to another calculation circuit, producing correction data by a previously described method using another calculation circuit, so that the thus produced correction data is supplied to the storage circuit 21, and is stored therein.

Now, an example of application using the temperature detector circuit of the present invention will be described here.

FIG. 4 shows a circuit configuration of an oscillator circuit for causing oscillation at an always constant frequency without depending on a change in atmospheric temperature by utilizing digital data according to the atmospheric temperature obtained by the temperature detector circuit of the present invention.

This oscillator circuit uses a crystal oscillator 31 as an oscillation source, and an inverter 32 configuring a feedback circuit, and a feedback resistor 33 are connected in parallel between both of the terminals of the crystal oscillator 31. In addition, capacitors 34 and 35 serving as capacitive loads are inserted into each terminal of the crystal oscillator 31 and a node of a ground voltage. A varicap diode 36 serving as a variable capacitor element is connected to another capacitor 34.

In general, it is known that in an oscillator circuit using a crystal oscillator, a value of the capacitive load connected to the crystal oscillator is changed, whereby the oscillation frequency changes. Therefore, a value of a control voltage to be input to the varicap diode 36 is changed, whereby the oscillation frequency changes.

When an atmospheric temperature changes, the frequency specific to the crystal oscillator changes accordingly, and a oscillation frequency changes. Therefore, a control voltage having a value according to a change in atmospheric temperature is imparted to the varicap diode 36, and the capacitance of the varicap diode 36 is changed in a direction in which the change in frequency specific to the crystal oscillator due to a temperature change is offset, whereby oscillation can be always effected at a constant frequency without depending on an atmospheric temperature.

In this case, the digital data after correction which is output from a temperature detector circuit comprising a temperature detector section 10 and a correcting section 20 configured in the same way as that shown in FIG. 2 is converted into an analog voltage by means of an DA converter 30. This analog voltage is imparted as a control voltage to the varicap diode 36. In this manner, the capacitance of the varicap diode 36 changes in a direction in which a change in frequency specific to the crystal oscillator due to a temperature change is offset according to a change in atmospheric temperature, whereby the oscillator circuit oscillates at a constant frequency.

In addition, dispersion occurs in characteristics of the diode 12 (shown in FIG. 2) in the respective temperature detector circuits. Even if there occurs a difference in digital data output from the AD converter (shown in FIG. 2) under the same temperature condition, there does not occur a substantial difference in digital data output from the calculating circuit 22 in the respective temperature detector circuit. Thus, there does not occur dispersion in oscillation frequency caused by various fluctuation factors during a manufacturing process.

Of course, the present invention is not limited to the above embodiments, and various modification can occurs without departing from the spirit of the invention. For example, in the above embodiments, although there has been described a case in which a circuit using a constant current circuit and a diode is used to obtain an analog signal according to an atmospheric temperature, this may be accomplished by using a voltage divider circuit using a pair of resistors 41 and 42 each having a predetermined temperature coefficient as shown in FIG. 5A, for example. Alternatively, as shown in FIG. 5B, a circuit using a resistor 43 may be used in place of the previously mentioned constant current circuit 11. Further, as shown in FIG. 5C, a circuit using a resistor 44 having a predetermined temperature coefficient may be used in place of the previously mentioned diode 12.

As has been described above, according to the present invention, there can be provided a temperature detector circuit capable of obtaining a digital output which is substantially identical under the same temperature condition without depending on various fluctuation factors during a process for manufacturing an element for generating an analog signal according to an atmospheric temperature.

In addition, according to the present invention, there can be provided an oscillator circuit for causing oscillation at an always constant frequency without depending on various fluctuation factors during an element manufacturing process.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A temperature detector circuit having a function for restricting an occurrence of an output error caused by dispersion in element manufacture comprising:

an analog signal generator circuit configured to generate an analog signal which changes according to an atmospheric temperature;

an AD converter circuit configured to receive the analog signal and convert the analog signal into digital data to be output;

a data storage circuit configured to store correction data in advance according to digital data obtained by the AD converter circuit under a known arbitrary temperature condition and read the stored correction data; and a calculating circuit configured to receive digital data obtained by the AD converter circuit under an unknown temperature condition and the correction data read from the data storage circuit, and output digital data corrected by performing calculating between these data, wherein the AD converter circuit outputs the digital data so that the digital data changes linearly in units of one bit every time an atmospheric temperature changes by 1° C., and the calculating circuit executes a calculation of Sa−(Ta−Tk)−Sk to obtain the correction data where, under a known arbitrary temperature condition, the digital data output from the AD converter circuit is defined as Sa; an expected value of digital data output from the AD converter circuit at a reference temperature is defined as Sk; the known arbitrary temperature is defined as Ta; and the reference temperature is defined as Tk.

2. The temperature detector circuit according to claim 1, wherein the analog signal generator circuit has a diode which includes an anode and a cathode, a path between the anode and the cathode of the diode is inserted between a power voltage supply node and a ground voltage supply node; and a constant current circuit connected to the diode in series, the constant current circuit supplying a constant current to the diode.

3. The temperature detector circuit according to claim 1, wherein the analog signal generator circuit includes two resistors having predetermined temperature coefficients, respectively, the two resistors being connected in series between a power voltage supply node and a ground voltage supply node.

4. The temperature detector circuit according to claim 1, wherein the analog signal generator circuit comprises a resistor inserted between a power voltage supply node and a ground voltage supply node, the resistor having a predetermined temperature coefficient; and a constant current circuit connected to the resistor in series, the constant current circuit supplying a constant current to the resistor.

5. An oscillator circuit comprising:

an analog signal generator circuit configured to generate an analog signal which changes according to an atmospheric temperature;

an AD converter circuit configured to receive the analog signal and convert the analog signal into digital data to be output;

a data storage circuit configured to store correction data in advance according to digital data obtained by the AD converter circuit under a known arbitrary temperature condition, and read the stored correction data;

a calculating circuit configured to receive digital data obtained by the AD converter circuit under an unknown temperature condition and correction data read from the data storage circuit, and output the digital data corrected by performing calculation between these data;

a DA converter circuit configured to receive the corrected digital data output from the calculating circuit and convert the digital data into an analog signal to be output;

a crystal oscillator having one end and the other end;

a feedback circuit connected between one end and the other end of the crystal oscillator;

a first capacitor connected between one end of the crystal oscillator and a supply node of a determined voltage;

a second capacitor connected between the other end of the crystal oscillator and the supply node of the predetermine voltage; and a variable capacitor element connected in series into the second capacitor between one end of the crystal oscillator and the supply node of the predetermined voltage, the element receiving the analog signal output from the DA converter circuit and causing a value to be changed according to the analog signal, wherein the AD converter circuit outputs the digital data so that the digital data changes linearly in units of one bit every time an atmospheric temperature changes by 1° C., and the calculating circuit executes a calculation of Sa−(Ta−Tk)−Sk to obtain the correction data where, under a known arbitrary temperature condition, the digital data output from the AD converter circuit is defined as Sa; an expected value of digital data output from the AD converter circuit at a reference temperature is defined as Sk; the known arbitrary temperature is defined as Ta; and the reference temperature is defined as Tk.

6. The oscillator circuit according to claim 5, wherein the analog signal generator circuit has a diode which includes an anode and a cathode, a path between the anode and cathode of the diode inserted between a power voltage supply node and a ground voltage supply node; and a constant current circuit connected to the diode in series, the constant current circuit supplying a constant current to the diode.

7. The oscillator circuit according to claim 5, wherein the analog signal generator circuit includes two resistors having predetermined temperature coefficients, respectively, the two resistors being connected in series between a power voltage supply node and a ground voltage supply node.

8. The oscillator circuit according to claim 5, wherein the analog signal generator circuit comprises a resistor inserted between a power voltage supply node and a ground voltage supply node, the resistor having a predetermined temperature coefficient; and a constant current circuit connected to the resistor in series, the constant current circuit supplying a constant current to the resistor.

* * * * *